United States Patent
Escamilla et al.

(10) Patent No.: US 11,089,713 B2
(45) Date of Patent: Aug. 10, 2021

(54) SYSTEMS AND METHODS FOR REDIRECTION OF AIRFLOW IN AN INFORMATION HANDLING SYSTEM AFTER AN AIR MOVER FAULT

(71) Applicant: Dell Products L.P., Round Rock, TX (US)

(72) Inventors: Eduardo Escamilla, Round Rock, TX (US); Corey D. Hartman, Hutto, TX (US); Zhen Huang, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 112 days.

(21) Appl. No.: 16/679,813

(22) Filed: Nov. 11, 2019

(65) Prior Publication Data

US 2021/0144883 A1    May 13, 2021

(51) Int. Cl.
*H05K 7/20*    (2006.01)
*F04D 25/10*    (2006.01)
(Continued)

(52) U.S. Cl.
CPC ......... *H05K 7/20145* (2013.01); *F04D 25/10* (2013.01); *F04D 29/462* (2013.01);
(Continued)

(58) Field of Classification Search
CPC ..... H05K 7/20145; F04D 25/10; F04D 25/16; F04D 29/462; F04D 29/563
See application file for complete search history.

(56) References Cited

U.S. PATENT DOCUMENTS 6,007,421 A * 12/1999 Schwarz ............ B60H 1/00678
137/601.18
6,710,240 B1 * 3/2004 Chen .................. H05K 7/20145
174/135

(Continued)

*Primary Examiner* — Woody A Lee, Jr.
*Assistant Examiner* — Brian O Peters
(74) *Attorney, Agent, or Firm* — Jackson Walker L.L.P.

(57) ABSTRACT

A vane assembly may be configured to mechanically couple to a first air mover and a second air mover, and the vane assembly may include a first set of one or more vanes configured to be proximate to the first air mover when the vane assembly is mechanically coupled to the first air mover and the second air mover and a second set of one or more vanes configured to be proximate to the second air mover when the vane assembly is mechanically coupled to the first air mover and the second air mover. The first set of one or more vanes and the second set of one or more vanes may be configured to be arranged relative to the first air mover and the second air mover such that when the first air mover and the second air mover are operational, the first set of one or more vanes and the second set of one or more vanes each assume a respective first position allowing air to flow from the first air mover and the second air mover and when the first air mover is failed and the second air mover is operational the first set of one or more vanes assumes a second position to prevent recirculation of air through the first air mover and at least one of the second set of one or more vanes assumes a third position to redirect air flow of the second air mover to compensate for failure of the first air mover.

20 Claims, 4 Drawing Sheets

(51) Int. Cl.
*F04D 25/16* (2006.01)
*F04D 29/46* (2006.01)
*F04D 29/56* (2006.01)
*G06F 1/20* (2006.01)

(52) U.S. Cl.
CPC ............ *F04D 29/563* (2013.01); *F04D 25/16* (2013.01); *G06F 1/20* (2013.01)

(56) References Cited

U.S. PATENT DOCUMENTS

| | | | |
|---|---|---|---|
| 8,422,227 B2 * | 4/2013 | Lai | H05K 7/20145 361/695 |
| 9,433,124 B2 * | 8/2016 | Wilcox | F04D 29/522 |
| 9,695,829 B2 * | 7/2017 | Anderl | B23P 19/00 |
| 2017/0042061 A1 | 2/2017 | Chen et al. | |

* cited by examiner

SYSTEMS AND METHODS FOR REDIRECTION OF AIRFLOW IN AN INFORMATION HANDLING SYSTEM AFTER AN AIR MOVER FAULT

TECHNICAL FIELD

The present disclosure relates in general to information handling systems, and more particularly to redirection of airflow in a system for cooling an information handling system and components thereof after occurrence of an air mover fault.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Often, air movers are used in a redundant configuration in information handling systems, wherein a plurality of air movers are installed, configured, and arranged such that in case of a fault of one air mover, the remaining air movers may be sufficient to meet the cooling needs of the information handling system. However, during an air mover fault, some components in the airflow path of the faulted air mover may not be sufficiently cooled in the absence of air redirection from other non-faulted air movers. Also, due to an air mover fault, it may be necessary to reduce recirculation of air by reducing or eliminating passage of air through the exhaust of a failed or faulted air mover.

SUMMARY

In accordance with the teachings of the present disclosure, the disadvantages and problems associated with airflow recirculation and redirection in a cooling system of an information handling system and components thereof may be substantially reduced or eliminated.

In accordance with embodiments of the present disclosure, a system may include a first air mover, a second air mover, and a vane assembly mechanically coupled to the first air mover and the second air mover. The vane assembly may include a first set of one or more vanes proximate to the first air mover and a second set of one or more vanes proximate to the second air mover. The first set of one or more vanes and the second set of one or more vanes may be arranged relative to the first air mover and the second air mover such that when the first air mover and the second air mover are operational, the first set of one or more vanes and the second set of one or more vanes each assume a respective first position allowing air to flow from the first air mover and the second air mover and, when the first air mover is failed and the second air mover is operational, the first set of one or more vanes assumes a second position to prevent recirculation of air through the first air mover and at least one of the second set of one or more vanes assumes a third position to redirect air flow of the second air mover to compensate for failure of the first air mover.

In accordance with these and other embodiments of the present disclosure, a vane assembly may be configured to mechanically couple to a first air mover and a second air mover, and the vane assembly may include a first set of one or more vanes configured to be proximate to the first air mover when the vane assembly is mechanically coupled to the first air mover and the second air mover and a second set of one or more vanes configured to be proximate to the second air mover when the vane assembly is mechanically coupled to the first air mover and the second air mover. The first set of one or more vanes and the second set of one or more vanes may be configured to be arranged relative to the first air mover and the second air mover such that when the first air mover and the second air mover are operational, the first set of one or more vanes and the second set of one or more vanes each assume a respective first position allowing air to flow from the first air mover and the second air mover and when the first air mover is failed and the second air mover is operational the first set of one or more vanes assumes a second position to prevent recirculation of air through the first air mover and at least one of the second set of one or more vanes assumes a third position to redirect air flow of the second air mover to compensate for failure of the first air mover.

In accordance with these and other embodiments of the present disclosure, a method may include mechanically coupling, to a vane assembly configured to mechanically couple to a first air mover and a second air mover, a first set of one or more vanes configured to be proximate to the first air mover when the vane assembly is mechanically coupled to the first air mover and the second air mover. The method may also include mechanically coupling, to the vane assembly, a second set of one or more vanes configured to be proximate to the second air mover when the vane assembly is mechanically coupled to the first air mover and the second air mover. The method may further include arranging the first set of one or more vanes and the second set of one or more vanes such that when the first air mover and the second air mover are operational, the first set of one or more vanes and the second set of one or more vanes each assume a respective first position allowing air to flow from the first air mover and the second air mover and when the first air mover is failed and the second air mover is operational, the first set of one or more vanes assumes a second position to prevent recirculation of air through the first air mover and at least one of the second set of one or more vanes assumes a third position to redirect air flow of the second air mover to compensate for failure of the first air mover.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1:
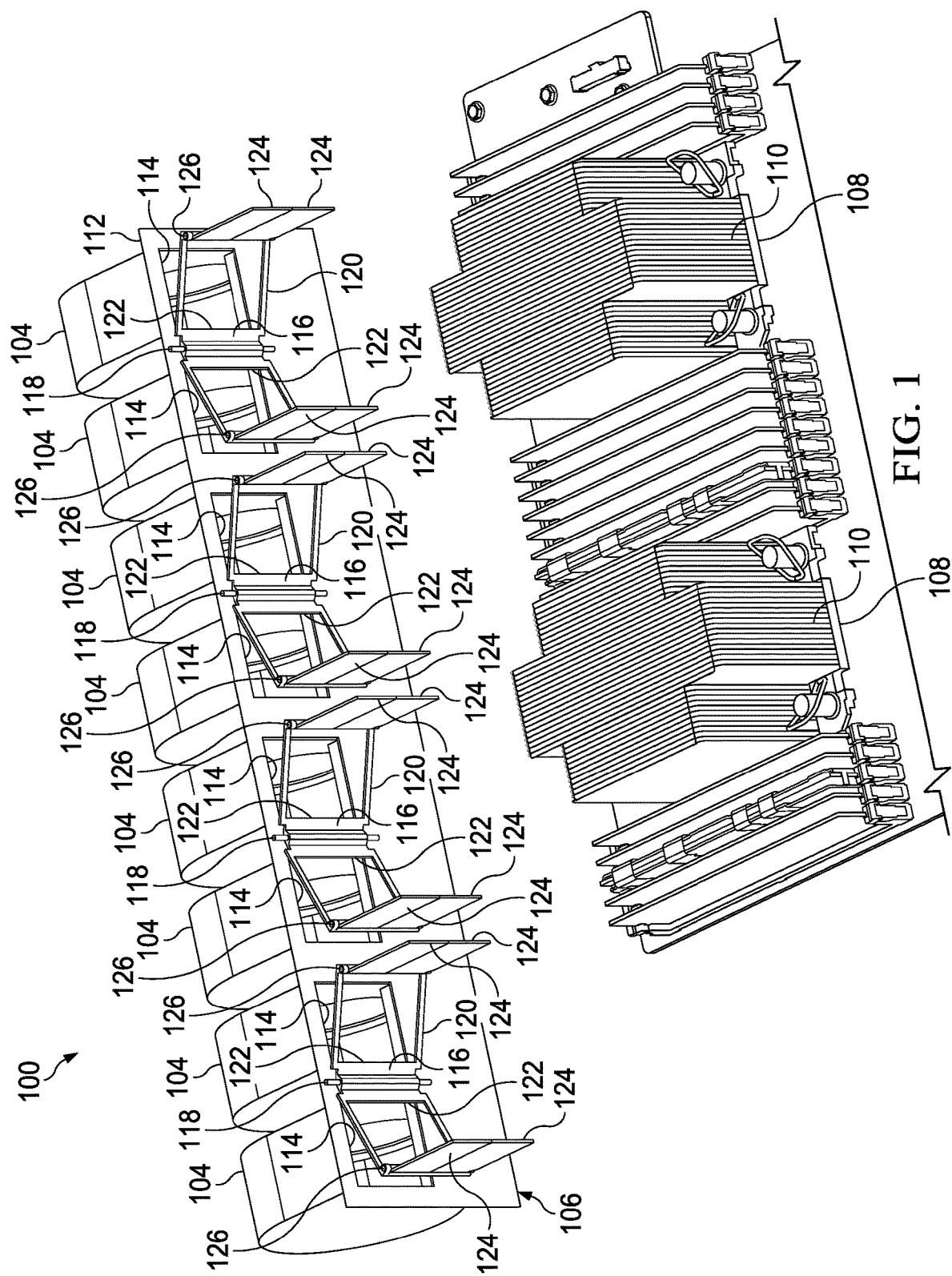
FIG. 1 illustrates selected components of an example information handling system having a plurality of air movers for cooling information handling resources of the information handling system and further comprising a vane assembly, in accordance with the present disclosure.

FIG. 1 illustrates selected components of an example information handling system 100 having a plurality of air movers 104 for cooling information handling resources of the information handling system and further comprising a vane assembly 106, in accordance with the present disclosure.

In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As shown in FIG. 1, air movers 104 may be arranged to direct airflow over components of information handling system 100. As shown in FIG. 1, in some embodiments, such components may include a motherboard 102 with heat-generating information handling resources 108 (e.g., processors) mounted thereto, and heat-rejecting media 110 (e.g., heatsinks) in thermal communication with heat-generating information handling resources 108, such that heat-rejecting media 110 transfers heat to air driven by air movers 104, thereby providing cooling to heat-generating information handling resources 108.

Although FIG. 1 depicts particular components of information handling system 100, it is understood that information handling system 100 may include one or more other components in addition to or in lieu of those shown in FIG. 1. For example, for the purposes of clarity of exposition, information handling system 100 is depicted without an enclosure (e.g., housing, chassis, etc.) for housing various components of information handling system 100. Further, although information handling system 100 is depicted as including eight air movers 104, information handling system 100 may include any number of air movers 104. In addition, although a particular configuration of air movers 104 is depicted, air movers 104 may be configured in any suitable manner.

Each air mover 104 may be any mechanical or electro-mechanical system, apparatus, or device operable to move air and/or other gases. For example, in some embodiments, air movers 104 may comprise fans. In other embodiments, air movers 104 may comprise blowers. In operation, each air mover 104 may draw cool air into an enclosure of information handling system 100 from the outside of such enclosure, and move air across heat-rejecting media 110 to cool one or more information handling resources (e.g., heat-generating information handling resources 108) of information handling system 100.

Figure 2:
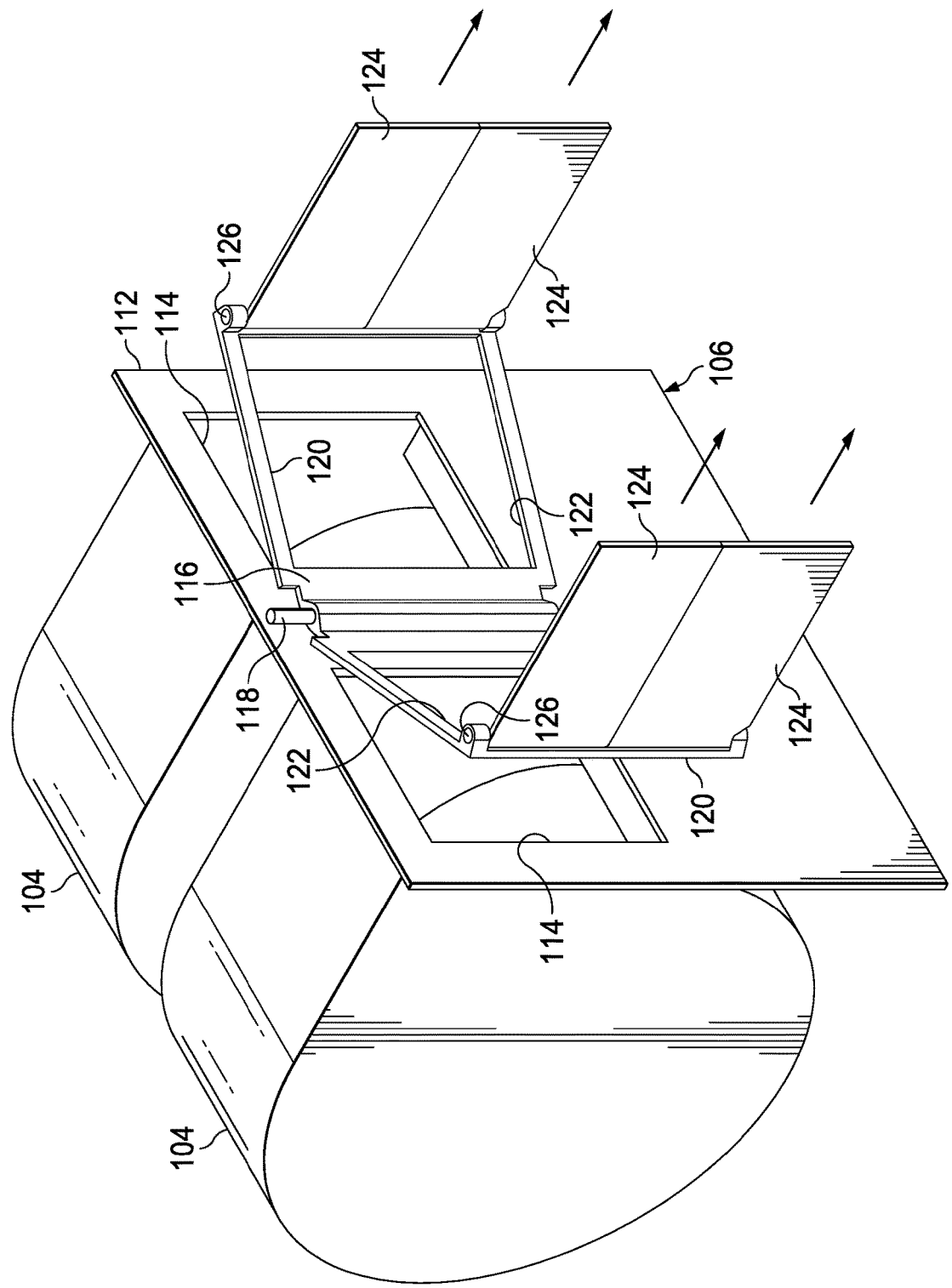
FIG. 2 illustrates a pair of air movers and a vane assembly coupled thereto, in accordance with the present disclosure.

As shown in FIG. 1, a vane assembly 106 may be mechanically coupled to the plurality of air movers 104. In addition, FIG. 2 illustrates a pair of air movers 104 and a vane assembly 106 coupled thereto, in accordance with the present disclosure. Each of FIGS. 1 and 2 depict air movers 104 and vane assembly 106 in the absence of failure of any air mover 104, such that all air movers 104 are driving airflow therefrom.

As shown in FIGS. 1 and 2, vane assembly 106 may include a bulkhead 112 mechanically coupled to air movers 104, such bulkhead 112 including openings 114, each opening 114 arranged proximate to the airflow outputs of a respective air mover 104, to allow air driven by air movers 104 to pass through such openings 114.

Vane assembly 106 may also include a plurality of rockers 116 (e.g., one rocker 116 per pair of air movers 104), each rocker 116 rotatably coupled to bulkhead 112 via a hinge 118 located between adjacent openings 114 of bulkhead 112. Each rocker 116 may include two wings 120, each wing 120 substantially symmetric to the other wing about an axis defined by hinge 118, and wings 120 forming an obtuse angle with respect to each other at such axis. Each wing 120 may have an opening 122, such opening 122 arranged proximate to airflow outputs of a respective air mover 104, to allow air driven by air movers 104 to pass through such openings 122.

Each wing 120 may have rotatably coupled thereto, at an end of such wing 120 opposite of hinge 118, one or more vanes 124. Vanes 124 may be coupled to a wing 120 via a hinge 126 that has an axis substantially parallel to the axis of hinge 118. In addition, each vane 124 may be mechanically coupled to a wing 120 via a spring that may bias vanes 124 in a position that fully blocks (e.g., closes) opening 122 of such wing 120, such that air driven by an air mover 104 may overcome the spring force of such spring to cause vanes 124 to open allowing air to pass through opening 122. In addition, in some embodiments, vanes 124 and/or wings 120 may comprise mechanical stops that limit an angle at which vane 124 may open relative to the closed position.

In operation, when all air movers 104 are operational, it may be expected that all air movers 104 are delivering air flow at the same rate. Thus, assuming that rocker 116 is symmetric about hinge 118, it may be expected that each wing 120 would form approximately the same angle about hinge 118 relative to bulkhead 112, and it may be expected that exhaust air pressure from air movers 104 would cause vanes 124 on rocker 116 to be open to approximately the same angle relative to their respective openings 122, thus allowing airflow to blow directly from air movers 104 onto components of information handling system 100. However, in the case of a failure of an air mover 104, components of vane assembly 106 may be configured to redirect airflow from a non-failed air mover 104 while also preventing recirculation of air through failed air mover 104, as described in greater detail below.

Figure 3:
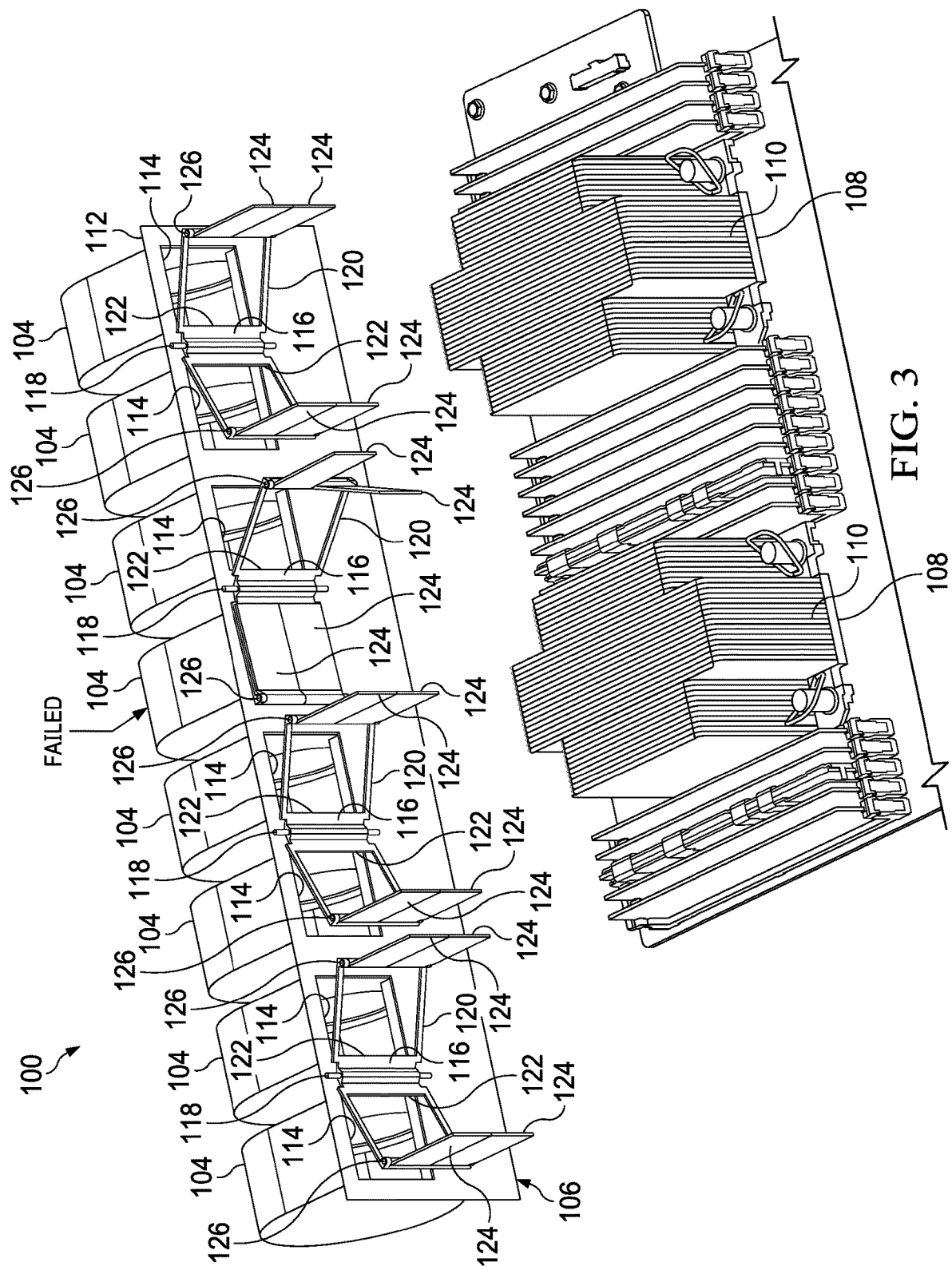
FIG. 3 illustrates the selected components of the information handling system of FIG. 1 with a failure of one of the plurality of air movers, in accordance with the present disclosure.
Figure 4:
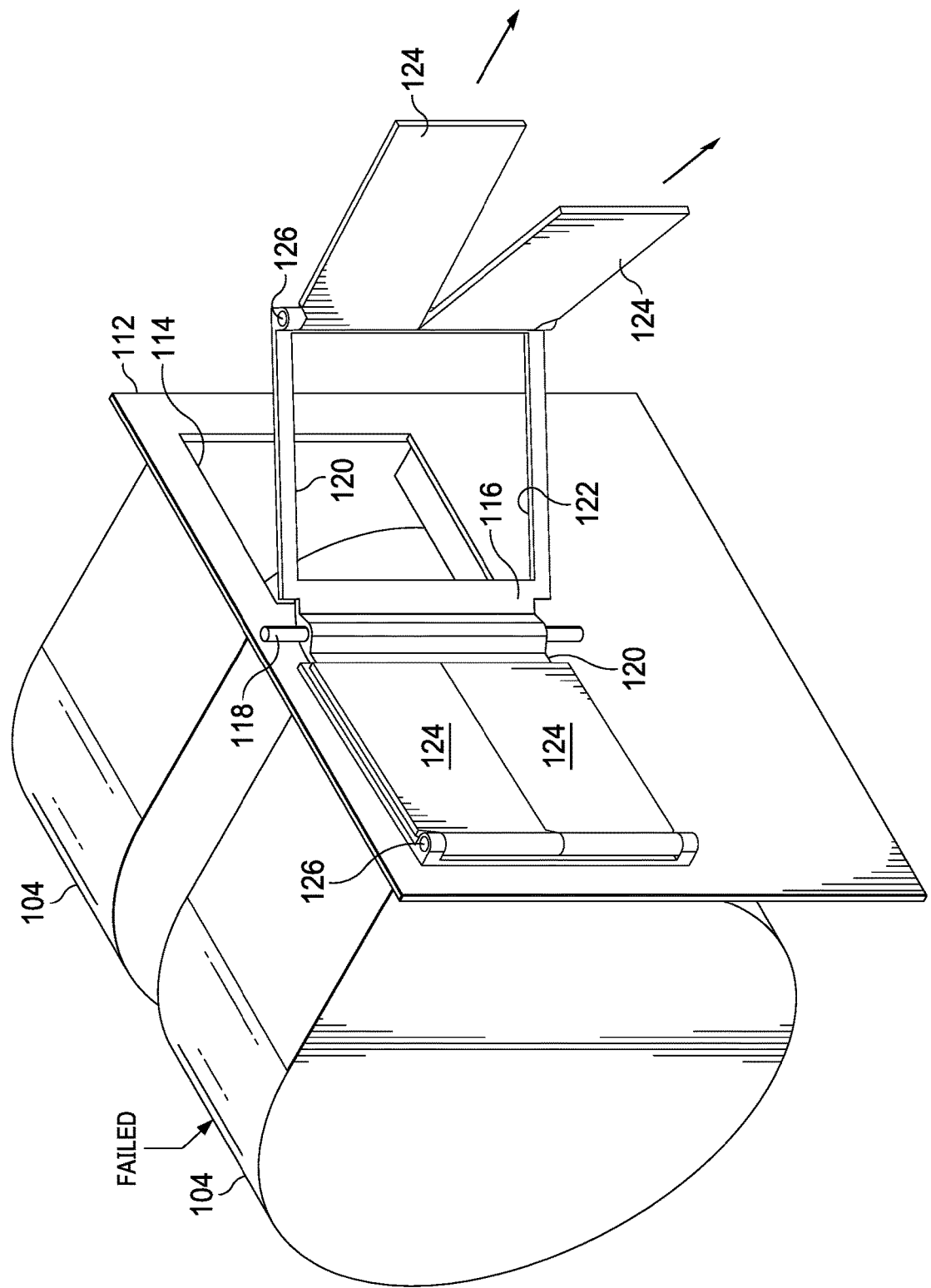
FIG. 4 illustrates the pair of air movers and vane assembly of FIG. 2 with a failure of one of the pair of air movers, in accordance with the present disclosure.

FIG. 3 illustrates information handling system 100 with a failure of one of the plurality of air movers 104 as labeled in FIG. 3, in accordance with the present disclosure. FIG. 4 illustrates a pair of air movers 104 and vane assembly 106 with a failure of one of the pair of air movers 104, in accordance with the present disclosure. As shown in FIGS. 3 and 4, in the case of a failure of an air mover 104, the sudden imbalance of exhaust air pressure between the failed air mover 104 and the adjacent air mover 104 with which the failed air mover 104 shares a common rocker 116 may cause vanes 124 to close opening 122 proximate to the failed air mover 104, as well as cause rotation of rocker 116 about hinge 118 such that vanes 124 close opening 114 proximate to the failed air mover 104. Such closure of openings 114 and 122 may serve to reduce or eliminate recirculation caused by failure of failed air mover 104. In addition, due to the differential air pressure, other vanes 124 proximate to the non-failed air mover 104 of a pair may rotate about hinge 126 toward failed air mover 104 and its downstream components, as limited by any mechanical stops between vanes 124 and hinge 126, to redirect airflow within information handling system 100 to compensate for failed air mover 104 (e.g., vanes 124 in front of the non-failed air mover 104 may move to a designed position that directs a portion of the airflow of the non-failed air mover 104 toward components otherwise cooled by the failed air mover 104 in the absence of failure).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a first air mover;
   a second air mover; and
   a vane assembly mechanically coupled to the first air mover and the second air mover, the vane assembly comprising:
      a first set of one or more vanes proximate to the first air mover; and
      a second set of one or more vanes proximate to the second air mover;
      wherein the first set of one or more vanes and the second set of one or more vanes are arranged relative to the first air mover and the second air mover such that:
         when the first air mover and the second air mover are operational, the first set of one or more vanes and the second set of one or more vanes each assume a respective first position allowing air to flow from the first air mover and the second air mover; and
         when the first air mover is failed and the second air mover is operational:
            the first set of one or more vanes assumes a second position to prevent recirculation of air through the first air mover; and
            at least one of the second set of one or more vanes assumes a third position to redirect air flow of the second air mover to compensate for failure of the first air mover.

2. The system of claim 1, wherein the first air mover and the second air mover each comprise a fan.

3. The system of claim 1, wherein the first air mover and the second air mover each comprise a blower.

4. The system of claim 1, wherein the vane assembly further comprises:
   a bulkhead having a first bulkhead opening proximate to the first air mover through which air driven by the first air mover flows and a second bulkhead opening proximate to the second air mover through which air driven by the second air mover flows; and
   a rocker rotatably coupled to the bulkhead about a first axis, the rocker comprising:
      a first wing proximate to the first bulkhead opening, wherein the first set of one or more vanes is rotatably coupled to the first wing about a second axis substantially parallel to the first axis and at an end of the first wing opposite the first axis; and
      a second wing proximate to the second bulkhead opening, wherein the second set of one or more vanes is rotatably coupled to the second wing about a third axis substantially parallel to the first axis and at an end of the second wing opposite the first axis.

5. The system of claim 4, wherein when the first air mover is failed and the second air mover is operational, the first set of one or more vanes is configured to cover the first bulkhead opening to prevent recirculation of air through the first air mover.

6. The system of claim 4, wherein:
   the first set of one or more vanes is mechanically coupled to the first wing at a first axis and in a manner configured to bias the first set of one or more vanes to cover the first bulkhead opening when the first air mover is failed; and
   the second set of one or more vanes is mechanically coupled to the second wing at a second axis and in a manner configured to bias the second set of one or more vanes to cover the second bulkhead opening when the second air mover is failed.

7. The system of claim 4, wherein:
   the first set of one or more vanes is mechanically coupled to the first wing by at least one mechanical stop that limits rotation of the first set of one or more vanes relative to the first wing; and
   the second set of one or more vanes is mechanically coupled to the second wing by at least one mechanical stop that limits rotation of the second set of vanes relative to the second wing.

8. A vane assembly configured to mechanically couple to a first air mover and a second air mover, the vane assembly comprising:
   a first set of one or more vanes configured to be proximate to the first air mover when the vane assembly is mechanically coupled to the first air mover and the second air mover; and
   a second set of one or more vanes configured to be proximate to the second air mover when the vane assembly is mechanically coupled to the first air mover and the second air mover;
   wherein the first set of one or more vanes and the second set of one or more vanes are configured to be arranged relative to the first air mover and the second air mover such that:
      when the first air mover and the second air mover are operational, the first set of one or more vanes and the second set of one or more vanes each assume a respective first position allowing air to flow from the first air mover and the second air mover; and
      when the first air mover is failed and the second air mover is operational:
         the first set of one or more vanes assumes a second position to prevent recirculation of air through the first air mover; and
         at least one of the second set of one or more vanes assumes a third position to redirect air flow of the second air mover to compensate for failure of the first air mover.

9. The vane assembly of claim 8, wherein the vane assembly further comprises:
   a bulkhead having a first bulkhead opening proximate to the first air mover through which air driven by the first air mover flows and a second bulkhead opening proximate to the second air mover through which air driven by the second air mover flows; and
   a rocker rotatably coupled to the bulkhead about a first axis, the rocker comprising:
      a first wing proximate to the first bulkhead opening, wherein the first set of one or more vanes is rotatably coupled to the first wing about a second axis substantially parallel to the first axis and at an end of the first wing opposite the first axis; and
      a second wing proximate to the second bulkhead opening, wherein the second set of one or more vanes is rotatably coupled to the second wing about a third axis substantially parallel to the first axis and at an end of the second wing opposite the first axis.

10. The vane assembly of claim 9, wherein when the first air mover is failed and the second air mover is operational, the first set of one or more vanes is configured to cover the first bulkhead opening to prevent recirculation of air through the first air mover.

11. The vane assembly of claim 9, wherein:
the first set of one or more vanes is mechanically coupled to the first wing at a first axis and in a manner configured to bias the first set of one or more vanes to cover the first bulkhead opening when the first air mover is failed; and
the second set of one or more vanes is mechanically coupled to the second wing at a second axis and in a manner configured to bias the second set of one or more vanes to cover the second bulkhead opening when the second air mover is failed.

12. The vane assembly of claim 9, wherein:
the first set of one or more vanes is mechanically coupled to the first wing by at least one mechanical stop that limits rotation of the first set of one or more vanes relative to the first wing; and
the second set of one or more vanes is mechanically coupled to the second wing by at least one mechanical stop that limits rotation of the second set of one or more vanes relative to the second wing.

13. A method comprising:
mechanically coupling, to a vane assembly configured to mechanically couple to a first air mover and a second air mover, a first set of one or more vanes configured to be proximate to the first air mover when the vane assembly is mechanically coupled to the first air mover and the second air mover;
mechanically coupling, to the vane assembly, a second set of one or more vanes configured to be proximate to the second air mover when the vane assembly is mechanically coupled to the first air mover and the second air mover; and
arranging the first set of one or more vanes and the second set of one or more vanes such that:
when the first air mover and the second air mover are operational, the first set of one or more vanes and the second set of one or more vanes each assume a respective first position allowing air to flow from the first air mover and the second air mover; and
when the first air mover is failed and the second air mover is operational:
the first set of one or more vanes assumes a second position to prevent recirculation of air through the first air mover; and
at least one of the second set of one or more vanes assumes a third position to redirect air flow of the second air mover to compensate for failure of the first air mover.

14. The method of claim 13, further comprising:
rotatably coupling about a first axis a rocker to a bulkhead having a first bulkhead opening proximate to the first air mover through which air driven by the first air mover flows and a second bulkhead opening proximate to the second air mover through which air driven by the second air mover flows, wherein the rocker comprises:
a first wing proximate to the first bulkhead opening, wherein the first set of one or more vanes is rotatably coupled to the first wing about a second axis substantially parallel to the first axis and at an end of the first wing opposite the first axis; and
a second wing proximate to the second bulkhead opening, wherein the second set of one or more vanes is rotatably coupled to the second wing about a third axis substantially parallel to the first axis and at an end of the second wing opposite the first axis.

15. The method of claim 14, further comprising coupling the first set of one or more vanes to the rocker such that when the first air mover is failed and the second air mover is operational, the first set of one or more vanes is configured to cover the first bulkhead opening to prevent recirculation of air through the first air mover.

16. The method of claim 14, further comprising:
mechanically coupling the first set of one or more vanes to the first wing at a first axis and in a manner configured to bias the first set of one or more vanes to cover the first bulkhead opening when the first air mover is failed; and
mechanically coupling the second set of one or more vanes to the second wing at a second axis and in a manner configured to bias the second set of one or more vanes to cover the second bulkhead opening when the second air mover is failed.

17. The method of claim 14, further comprising:
mechanically coupling the first set of one or more vanes to the first wing by at least one mechanical stop that limits rotation of the first set of one or more vanes relative to the first wing; and
mechanically coupling the second set of vanes to the second wing by at least one mechanical stop that limits rotation of the second set of one or more vanes relative to the second wing.

18. The method of claim 13, further comprising mechanically coupling the vane assembly to the first air mover and the second air mover.

19. The method of claim 18, wherein the first air mover and the second air mover each comprise a fan.

20. The method of claim 18, wherein the first air mover and the second air mover each comprise a blower.

* * * * *